(12) United States Patent
Nolan et al.

(10) Patent No.: US 7,973,684 B2
(45) Date of Patent: Jul. 5, 2011

(54) SELF AUTO-CALIBRATION OF ANALOG CIRCUITS IN A MIXED SIGNAL INTEGRATED CIRCUIT DEVICE

(75) Inventors: James B. Nolan, Chandler, AZ (US); Kumen Blake, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 41 days.

(21) Appl. No.: 12/559,579

(22) Filed: Sep. 15, 2009

(65) Prior Publication Data

US 2010/0103005 A1   Apr. 29, 2010

Related U.S. Application Data

(60) Provisional application No. 61/108,638, filed on Oct. 27, 2008.

(51) Int. Cl.
*H03M 1/06* (2006.01)
(52) U.S. Cl. .............. 341/118; 341/120; 341/163; 330/9
(58) Field of Classification Search .................. 341/120, 341/163
See application file for complete search history.

(56) References Cited

U.S. PATENT DOCUMENTS

| | | | |
|---|---|---|---|
| 6,034,569 A | 3/2000 | Lan et al. | 330/290 |
| 6,459,335 B1 * | 10/2002 | Darmawaskita et al. | 330/9 |
| 7,463,087 B2 * | 12/2008 | Thiery | 330/9 |
| 7,532,065 B2 * | 5/2009 | Chen et al. | 330/9 |
| 7,636,013 B2 * | 12/2009 | Bach | 330/2 |

FOREIGN PATENT DOCUMENTS

WO   02/27943 A2   4/2002

OTHER PUBLICATIONS

International PCT Search Report and Written Opinion, PCT/US2009/062043, 10 pages, Mailed Mar. 18, 2010.

* cited by examiner

*Primary Examiner* — Khai M Nguyen
(74) *Attorney, Agent, or Firm* — King & Spalding L.L.P.

(57) ABSTRACT

Auto-calibration of the analog circuits occurs when requested by a user and/or the occurrence of an event(s). The user may invoke an auto-calibration on demand through an auto-calibration ($A_{CAL}$) input to the mixed-signal integrated circuit. An external voltage calibration ($V_{CAL}$) input may be used for auto-calibration of the mixed-signal integrated circuit to a user-supplied common-mode voltage reference. Auto-calibration of the mixed-signal integrated circuit may also be initiated upon the occurrence of any one or more of the following events: 1) detection of auto-calibration data corruption, e.g., parity checking of auto-calibration data values digitally stored in the mixed-signal integrated circuit; 2) an internal timer that causes a calibration request after a programmable timeout period, 3) change in the internal integrated circuit die temperature as determined by a temperature sensor, and 4) a change in the power supply and/or internal supply voltage(s).

24 Claims, 4 Drawing Sheets

SELF AUTO-CALIBRATION OF ANALOG CIRCUITS IN A MIXED SIGNAL INTEGRATED CIRCUIT DEVICE

RELATED PATENT APPLICATION

This application claims priority to commonly owned U.S. Provisional Patent Application Ser. No. 61/108,638; filed Oct. 27, 2008; entitled "Self Auto-Calibration of Analog Circuits in a Mixed Signal Integrated Circuit Device," by James B. Nolan and Kumen Blake; and is hereby incorporated by reference herein for all purposes.

TECHNICAL FIELD

The present disclosure relates to integrated circuits having analog input devices and, more particularly, to an auto-calibration circuit for minimizing input offset voltage in the integrated circuit analog input device.

BACKGROUND

Integrated circuits are becoming far more sophisticated while continuing to drop in price. Combinations of both analog and digital functions fabricated on an integrated circuit die, or packaged in a multi-chip package (MCP), are becoming more prevalent and are further increasing the usefulness and reducing the cost of consumer and industrial products. The combination of a microcontroller, and analog and digital circuit functions on an integrated circuit die or in an MCP has also expanded the useful range of applications. Consumer and commercial products, such as, for example, but not limited to, appliances, telecommunications devices, automobiles, security systems, full-house instant hot water heaters, thermostats and the like, are being controlled by integrated circuit microcontrollers. Analog inputs for receiving sensor information and analog outputs for controlling functions are necessary for the application of these microcontrollers. Heretofore separate and discrete analog-to-digital and digital-to-analog interfaces were used to connect the digital microcontroller to the outside analog world.

Analog input devices such as an analog-to-digital converter (ADC) in conjunction with a separate operational amplifier (op-amp) were used to convert a time-varying analog signal into digital representations thereof for coupling to digital inputs and use thereof by the microcontroller. Voltage and current levels were also detected by discrete integrated circuit voltage comparators that changed a digital output state when a certain analog value was present on the input of the comparator.

The op-amp (and comparator) is generally a differential input (inverting and non-inverting inputs) analog device, and the circuit of the op-amp has inherent direct current (DC) input offset voltage that causes the output of the op-amp to be nonzero with a zero input voltage between the differential inputs (e.g., inputs connected together). Many applications require an op-amp with a very small input offset voltage. To achieve a small input offset voltage, normally a calibration step in the production of the op-amp is required. This calibration step takes time during manufacturing/testing of the op-amp, and is therefore generally expensive to perform. The calibration is typically performed at one operating point (e.g., temperature, common mode voltage, etc.) such that changes in operating environment, e.g., temperature, voltage, etc., are not compensated for in the manufacturing/testing thereof. Technology has now advance to the point where the analog input and output devices can be fabricated on the same integrated circuit die on which the digital microcontroller, and its support logic and memories are also fabricated. This creates an additional problem in that the equipment used to test the digital microcontroller functions is not capable of performing on-line calibration of analog functions efficiently. Therefore, additional testing equipment and testing steps are required at the time of manufacture.

SUMMARY

Therefore there is a need for an analog input device that may be calibrated in an end user system application to meet the desired specifications and operating parameters over all operating conditions such as temperature, voltage, current, speed, power, pressure, humidity, etc., that may be encountered during normal operation and any changes thereof, and can be mass-produced to reduce overall product costs. The analog input device may be part of an integrated circuit having both analog and digital functions (e.g., a mixed-signal device). The analog input device may include, but is not limited to, a differential or single-ended input operational amplifier, a comparator, a programmable gain amplifier (PGA), an instrumentation amplifier (INA), low noise amplifier, etc. The teachings of this disclosure may also be extended to gain trimming of the PGA or the INA. An example of such an integrated circuit device is described in commonly owned U.S. Pat. No. 6,456,335; entitled "Auto-Calibration Circuit to Minimize Input Offset Voltage in an Integrated Circuit Analog Input Device," by Hartono Darmawaskita, Layton Eagar and Miguel Moreno; and is hereby incorporated by reference herein for all purposes.

This need may be satisfied, according to the teachings of this disclosure, with an apparatus and method for auto-calibration of the analog circuits when requested by a user and/or the occurrence of an event(s). The user may invoke an auto-calibration on demand through an auto-calibration ($A_{CAL}$) input to the mixed-signal integrated circuit. An external voltage calibration ($V_{CAL}$) input may be used for auto-calibration of the mixed-signal integrated circuit to a user-supplied common-mode voltage reference. Auto-calibration of the mixed-signal integrated circuit may also be initiated upon the occurrence of any one or more of the following events, such as for example but not limited to: 1) detection of auto-calibration data corruption, e.g., parity checking of auto-calibration data values digitally stored in the mixed-signal integrated circuit; 2) an internal timer that causes a calibration request after a programmable timeout period, 3) change in the internal integrated circuit die temperature as determined by a temperature sensor, and 4) change in the power supply and/or internal supply voltage(s) from internal regulator(s) (e.g., bias network).

In addition, a user may compensate for variations in the end system, including operating point, e.g., power supply, common-mode, etc.; environmental changes, e.g., temperature, humidity, etc.; and also to compensate for component drift over time, e.g., aging effects, etc.

The analog input device has input offset voltage compensation or a trimming circuit that counteracts or compensates for the device input offset voltage by applying, for example, but not limited to, an opposite polarity voltage between the differential inputs of the analog input device so as to minimize the resulting voltage error at the output of the analog device. Switching of resistances, current sources and/or voltage sources in the differential input circuit of the analog input device may be used to compensate for the input offset voltage error. In addition, a digital-to-analog converter (DAC) may be used to generate a compensation voltage to overcome the input offset voltage error. It is contemplated and within the scope of this disclosure that other ways of compensating for the input offset voltage error may be utilized so long as they can be controlled by applying a digital value thereto.

A digital control circuit is used to apply a digital word to the input offset voltage compensation circuit for determining a digital value representative of the required input offset voltage compensation. A linear search or binary search of various digital values of the digital word may be used by the digital control circuit. In addition, the digital control circuit may also control switching the inverting and non-inverting inputs, the output, and the feedback gain determining resistors of the analog input device during a "calibration mode" thereof.

A voltage comparator compares the output of the analog input device and a voltage reference. When the output of the analog input device is equal to or greater than the voltage reference, the comparator output switches from a first logic level to a second logic level. The output of the comparator is connected to the digital control circuit and signals the digital control circuit by changing its output logic level.

The voltage reference may be programmable for selecting a desired voltage value to be applied to the analog input device and comparator inputs during the calibration cycle. This allows the ability to vary the voltage reference so as to facilitate calibration at the common mode voltage which is very close to that of the application of use. The appropriate voltage reference value may be written to a control register associated with the voltage reference circuit before initiating the auto calibration of the analog input device. Different voltage reference values may be used for different analog input devices during input offset voltage compensation calibration thereof.

The input offset voltage compensation circuit of the analog input device may have a storage register or memory that retains the digital value required for compensating the input offset voltage. This storage register may be volatile or non-volatile depending upon the application desired. Therefore, no factory calibration during manufacture and/or testing is required, programmable fuse link trimming may be eliminated, and end user application flexibility increased.

A plurality of analog input devices may have their input offset voltages compensated for by multiplexing the digital control circuit and comparator between each of the plurality of analog input devices. Thus circuits and die area are reduced, saving costs and improving reliability of a mixed-signal integrated circuit device.

According to a specific example embodiment of this disclosure, an integrated circuit having at least one analog input device and an auto-calibration circuit to minimize input offset voltage in at least one analog input device comprises: at least one analog input device having a digitally controlled input offset voltage compensation circuit; and an auto-calibration circuit, said auto-calibration circuit being coupled to said at least one analog input device and to the input offset voltage compensation circuit, wherein input offset voltage is minimized in said at least one analog input device during an auto-calibration cycle that is initiated by an event.

According to another specific example embodiment of this disclosure, a method for minimizing an input offset voltage in an analog input device upon an occurrence of an event, comprises the steps of: (a) detecting an occurrence of an event; (b) switching from a normal mode to an auto-calibration mode upon detection of the occurrence of the event an analog input device having an input offset voltage compensation circuit; (c) applying a reference voltage to the analog input device; (d) minimizing an input offset voltage of the analog input device by: (i) measuring an output voltage of the analog input device; and (ii) applying input offset compensation values to the input offset voltage compensation circuit until the output voltage from the analog input device is at a desired value and then storing the input offset compensation value that minimizes the input offset voltage of the analog input device; and (e) switching the analog input device from the calibration mode to the normal mode.

BRIEF DESCRIPTION OF THE DRAWINGS

A more complete understanding of the present disclosure thereof may be acquired by referring to the following description taken in conjunction with the accompanying drawings wherein.

Figure 1:
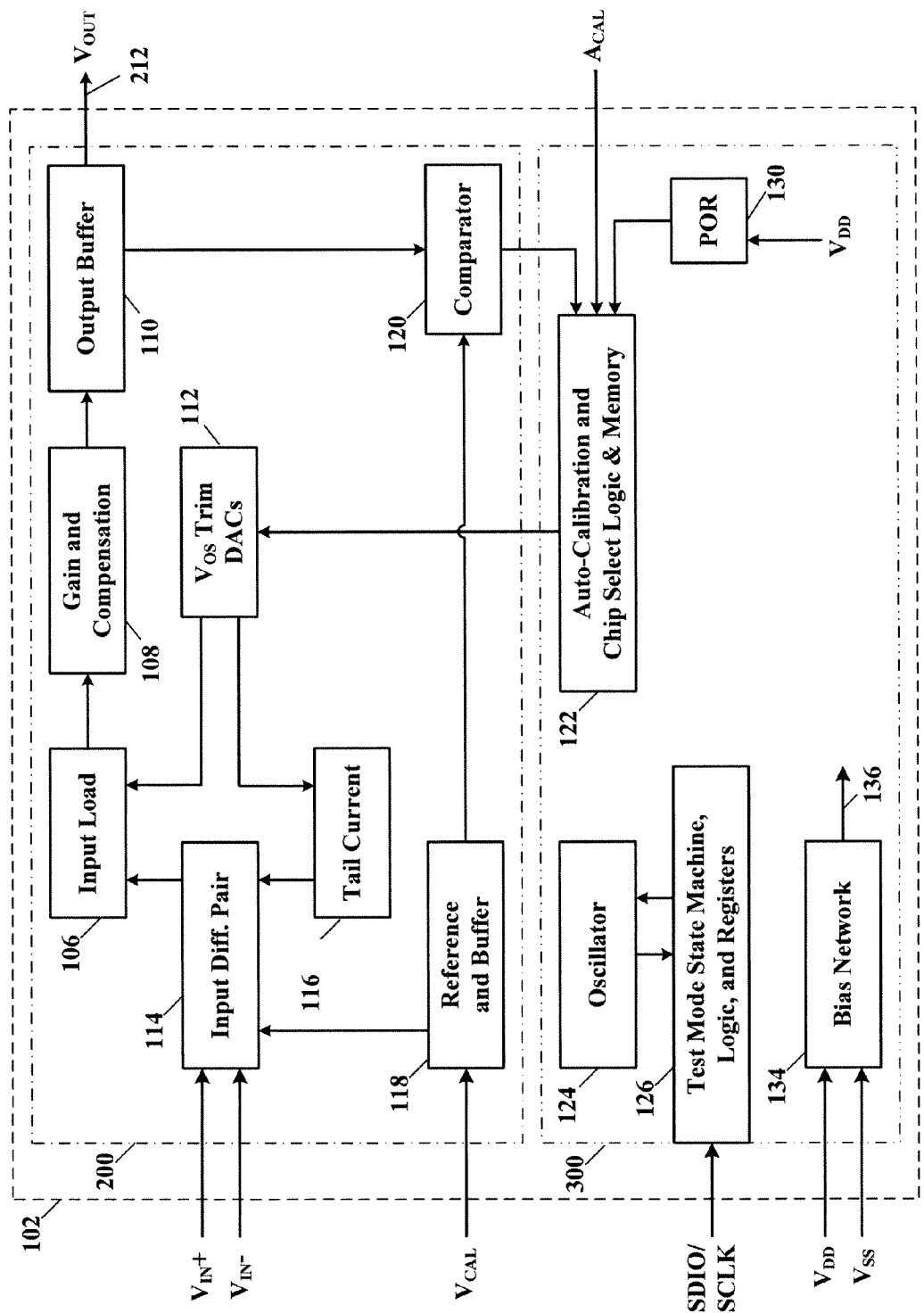
FIG. 1 illustrates a schematic block diagram of a self auto-calibration device for a differential input operational amplifier, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a self auto-calibration device for a differential input operational amplifier, according to a specific example embodiment of this disclosure. The self auto-calibration device 102 comprises an analog portion 200 (see FIG. 2) and a digital portion 300 (see FIG. 3). The analog portion 200 comprises an input differential pair 114, a gain and compensation circuit 108 and an output buffer 110 of a differential input operational amplifier, voltage offset compensation digital-to analog-converters (DACs) 112, an input load 106, a tail current circuit 116, a calibration voltage reference and buffer 118, and a voltage comparator 120. The digital calibration portion 300 comprises an auto-calibration, chip select logic and memory 122; clock oscillator 124, a test mode state machine 126, a power-on-reset (POR) 130, and a bias network 134.

The voltage offset compensation DACs 112 translate digital trim codes from the auto-calibration logic to an analog signal to "zero" the offset of the comparator 120. A segmented DAC may be used for the DAC 112 to improve the differential non-linearity (DNL) of the trimming operation, however, this is not a requirement for the auto-calibration approach of this disclosure. An advantage of a segmented DAC is fewer components are needed, and the DNL is improved because the DAC 112 is split into two arrays instead of a larger, single array.

The digital calibration portion 300, the comparator 120 and calibration reference 118 may be placed into a low power sleep mode when not being used to perform an auto-calibration as more fully described herein.

Figure 2:
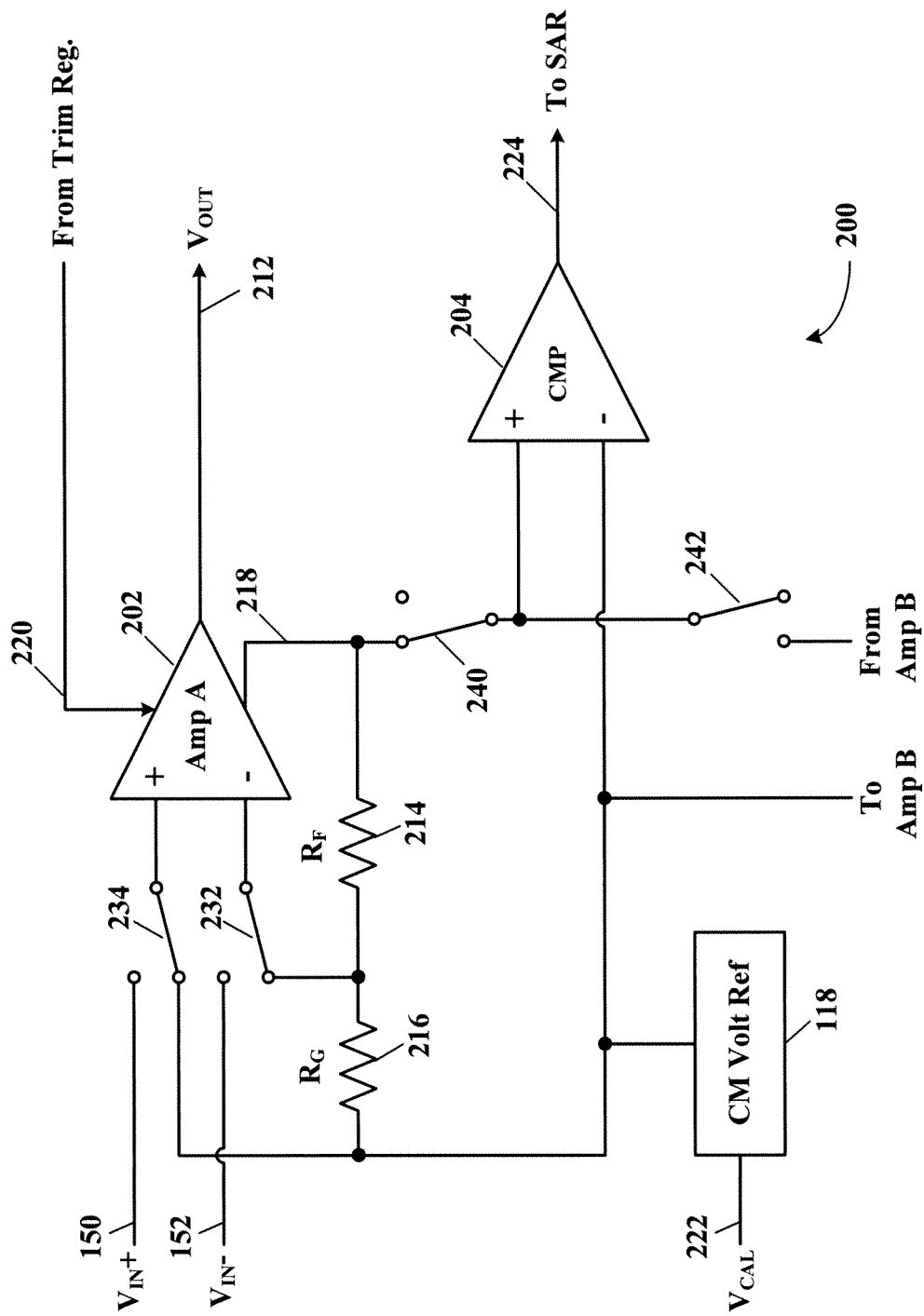
FIG. 2 illustrates a schematic block diagram of the analog portion of the self auto-calibration device shown in FIG. 1.

Referring to FIG. 2, depicted is a schematic block diagram of the analog portion of the self auto-calibration device shown in FIG. 1. A differential input operational amplifier 202, a comparator 204, and a common mode voltage reference 118 are coupled together through switches 232, 234 and 240. When in the self auto-calibrate mode, the switches 232 and 234 decouple the differential inputs of the operational amplifier 202 from the differential inputs 150 and 152, and couple the differential inputs to the common mode voltage reference 118. The common mode voltage reference 118 may consist of an internal voltage reference, for example but not limited to, $V_{DD}/3$.

The output of the operational amplifier 202 may be tri-stated so as to make the auto-calibration as transparent as possible to an application, and to prevent external circuitry from influencing the calibration accuracy and timing of the auto-calibration operation. To avoid having to add a switch between the output of the operational amplifier 202 and the output connection 212, a separate calibration output 218 may be enabled from within the operational amplifier 202 to operate during the self auto-calibration trimming operation. This calibration output 218 uses much smaller transistors then the normal output because it only has to drive a light (internal) resistive load (an input of the comparator 204 and resistor network $R_F/R_G$) during the auto-calibration operation.

During the auto-calibration operation, the common mode voltage reference 118 is coupled to an input of the operational amplifier 202. The common mode voltage reference 118 is also coupled to an input of the comparator 204. The operational amplifier 202 gain is configured with the gain setting resistors 214 and 216 for a high gain to facilitate an accurate voltage offset calibration thereof. The output 218 is coupled to the other input of the comparator 204. The output 224 from the comparator 204 is at a first logic state, e.g., logic high, when a voltage on the output 218 is equal to or greater than the common mode voltage reference 118. The output 224 from the comparator 204 is at a second logic state, e.g., logic low, when a voltage on the output 218 is less than the common mode voltage reference 118. The output 224 controls a successive approximation register (SAR) 306 (see FIG. 3), as more fully described hereinbelow. An offset cancellation voltage on the input 220 cancels out the operational amplifier 202 offset so that the output 212 of the operational amplifier 202 is at substantially zero volts. This offset cancellation voltage is maintained until the next self auto-calibration operation.

The voltage reference 118 may be programmable so that its voltage value can be set closest to a system operating condition so as to obtain best offset calibration. The voltage reference 118 and the comparator 204 may be used in auto-calibration operations for more then one operational amplifier 202. Switch 242 may be coupled to a second operational amplifier (not shown) and function in the same way as described herein for the auto-calibration of the operational amplifier 202. Thus a plurality of operational amplifiers 202 may be auto-calibrated according to the teachings of this disclosure.

Figure 3:
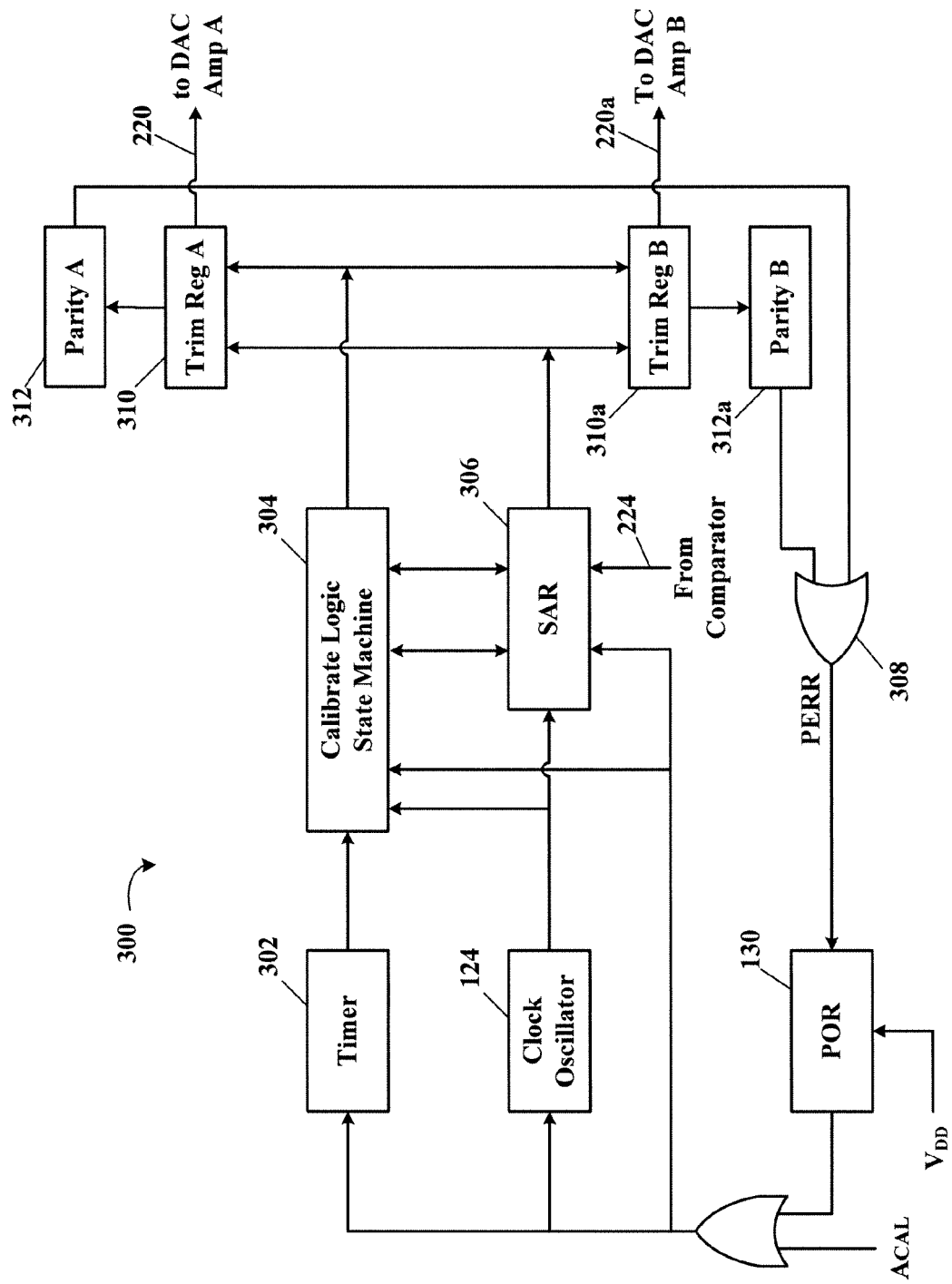
FIG. 3 illustrates a schematic block circuit diagram of the digital calibration portion of the self auto-calibration device shown in FIG. 1.

Referring to FIG. 3, depicted is a schematic block circuit diagram of a digital calibration portion of the self auto-calibration device shown in FIG. 1. The digital portion 300 of the auto-calibration device 102 comprises a timer 302, calibrate logic 304, a successive approximation register (SAR) 306, an OR gate 308 for logically indicating a error from any one of a plurality trim register parity detection circuits 312, a trim register 310, a trim register parity detection circuit 312, a power-on-reset (POR) 130, and a clock oscillator 124. A trim register 310 and a trim register parity detection circuit 312 may be associated with each operational amplifier 202. The remaining circuit functions may be time shared, for self auto-calibration purposes, between each one of a plurality of operational amplifiers 202.

Operation of the voltage offset compensation circuits during an auto-calibration mode are more fully described in commonly owned U.S. Pat. No. 6,456,335; entitled "Auto-Calibration Circuit to Minimize Input Offset Voltage in an Integrated Circuit Analog Input Device," by Hartono Darmawaskita, Layton Eagar and Miguel Moreno; and is hereby incorporated by reference herein for all purposes.

According to the teachings of this disclosure, whenever parity checking of the trim register contents detects a parity error therein, a self auto-calibration cycle is initiated. This may be implemented by using the trim register parity detection circuit 312 to detect a parity error in the trim data contents of the trim register 310. When a parity error is detected, the trim register parity detection circuit 312 asserts a parity error detected signal and the POR 130 will initiate the start of a new self auto-calibration cycle. An OR gate 308 may be used to combine parity error detected signals from a plurality of trim register parity detection circuits 312 associated with respective ones of a plurality of operational amplifiers 202. Other logic combinations may be implemented instead of an OR gate 308 and is contemplated herein.

During a self auto-calibration cycle, the parity bit may be automatically determined by the calibrate logic 304 and stored in a parity bit location of the trim register 310. In this example, there is one parity bit for each trim register 310. If a parity error occurs (during normal operation of the operational amplifier 202), a power-on-reset from the POR 130 is forced and a new auto-calibration cycle takes place. This is important because the trim register contents may be stored in volatile registers (memory), and the trim data contained therein may be corrupted during a power glitch. Also a soft data error may occur from cosmic radiation, e.g., space applications. Therefore, parity checking of the trim register 310 contents provides some protection against corruption of trim value data storage in a volatile memory configuration. On the other hand, the trim register contents may be stored in non-volatile memory, and a parity bit and parity checking may not be needed in a non-volatile memory configuration. It is contemplated and within the scope of this disclosure that trim data may be stored in volatile and/or non-volatile memory, with or without a parity bit and parity checking.

An auto-calibration may also be initiated by toggling a user programmed auto-calibration input, $A_{CAL}$ (see FIG. 1). This feature avoids having to power down the integrated circuit device to re-calibrate the operational amplifiers 202 therein. It also saves time because the delay time is much shorter than if a complete power-up is required (e.g., approximately 1 millisecond versus 150 milliseconds). Having the $A_{CAL}$ calibration input makes it easy for an applications program, e.g., a control signal from a microcontroller to cause a self auto-calibration by toggling a logic level to the $A_{CAL}$ calibration input. The microcontroller and/or circuits within the self auto-calibration device 102 could invoke a self auto-calibration, according to the teachings of this disclosure, based upon any change in a system conditions, e.g., power supply voltage, temperature, and/or at fixed time-intervals.

An external calibration reference voltage input ($V_{CAL}$) may be used to provide the reference voltage during the auto-calibration cycle to calibrate at the optimum common-mode voltage for a specific application. This removes common-mode voltage errors from the output of the operational amplifier 202.

A state machine may be used to calibrate a plurality of operational amplifiers 202. A single state machine, comparator and reference may therefore be used instead of requiring separate calibration circuits for each of the plurality of operational amplifiers 202 so as to save logic circuits required and related integrated circuit die area.

Figure 4:
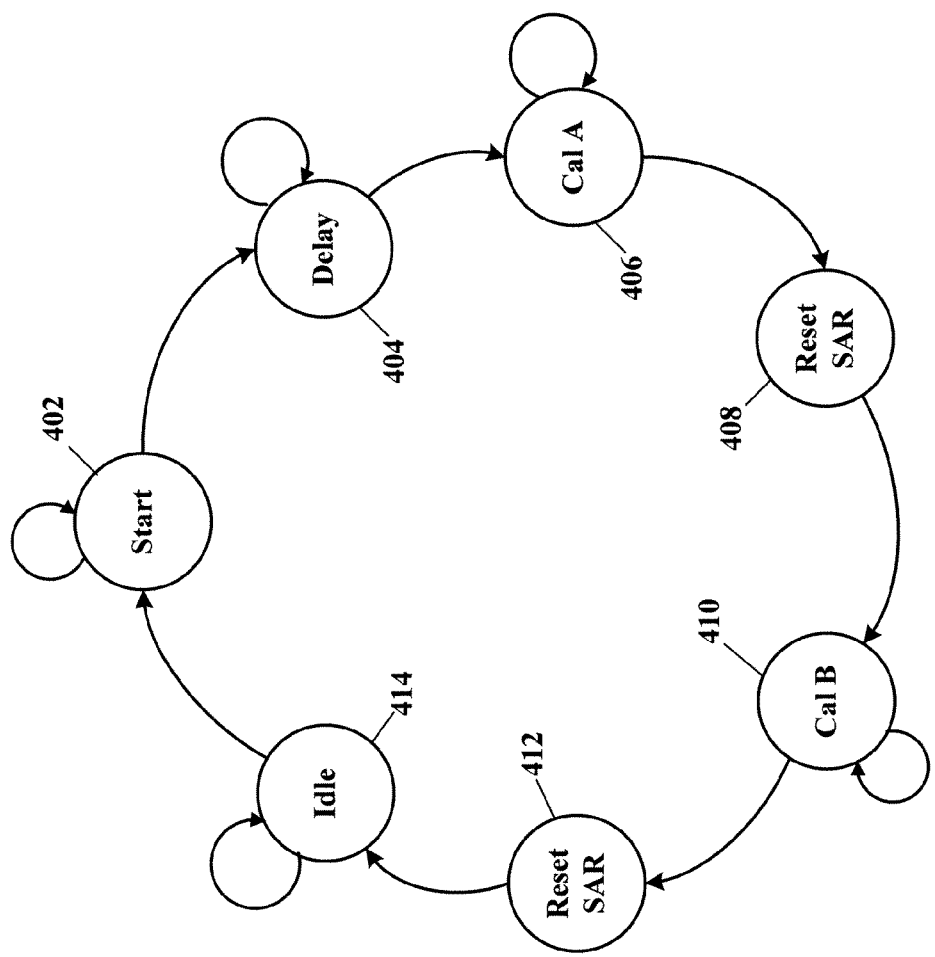
FIG. 4 illustrates a schematic state diagram of a calibration sequence of the self auto-calibration device shown in FIG. 1.

Referring to FIG. 4, depicted is a schematic state diagram of a calibration sequence of the self auto-calibration device shown in FIG. 1. A state machine may operate with the following states: In state 402 (Start), an event such as a POR or parity error has occurred, or the $A_{CAL}$ is asserted. The state machine waits for the initiation of one of these conditions to end before beginning the auto-calibration process (cycle). In state 404 (Delay), a delay timer operates to allow time for settling of the circuits involved in the auto-calibration. After a power-up, the delay may be approximately 150 milliseconds in order to allow the supply voltage to settle. After an $A_{CAL}$ input activation, about 1 millisecond delay typically occurs.

In state 406 (Cal A), a self auto-calibration cycle occurs for a first operational amplifier channel. Note, this example assumes a dual op-amp device, more then two op-amps may be calibrated in a similar fashion. The inputs of the amplifier are connected to the reference voltage. An internal gain of the op-amp may be, for example but not limited to, approximately 1000 so as to increase the offset error and make calibration easier. A comparator 204 is used to compare the output of the amplifier 202 (after the gain) to the reference voltage 118. The comparator output 224 is used to either set or clear the successive-approximation shift register (SAR) 306 bits one at a time, starting with the sign bit to determine whether to trim up or trim down. The sign bit is used to connect the trim DAC(s) 112 to either one side of the amplifier differential pair 114 or the other depending on whether the offset is positive or negative. The remaining SAR bits control the amount of trim to add starting with the MSB, one bit at a time until all the SAR register bits are either set or cleared. During this state, the SAR shift register outputs are passed through transparent latches (not shown) to the amplifier trim DACs 112. So as each SAR bit is changed, it immediately changes the analog output value of the trim DAC 112. In this manner the output of the amplifier 202 approaches the internal reference 118, and the offset approaches zero. At the end of the Cal A state 406, the transparent latches associated with the op amp A trim DAC are closed so the trim value is held (latched).

In state 408 (Reset SAR), the SAR register is reset for a next auto-calibration operation. In state 410 (Cal B), a similar cycle is performed as was performed during state 406 (Cal A). Then in state 412 the SAR register is reset again for future auto-calibration operations. Once the calibrations for both amplifiers A and B are is performed, the state machine enters state 414 (Idle) and the calibration logic and analog circuitry may be disabled to conserve power. The state machine remains in state 414 indefinitely until a power-on reset, parity error or $A_{CAL}$ request is asserted which then returns to the state 402 (Start) for subsequent calibration cycles.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit having an auto-calibration circuit to minimize input offset voltage in an operational amplifier, comprising:
   an operational amplifier having differential inputs, an output and a digitally controlled input offset voltage compensation circuit; and
   an auto-calibration circuit comprising
      a voltage comparator having first and second inputs,
      a voltage reference coupled to the first input of the voltage comparator,
      a voltage offset trim digital-to-analog converter (DAC),
      voltage offset calibration switches,
      a successive approximation register (SAR) having an input coupled to an output of the voltage comparator and outputs coupled to the voltage offset trim DAC, and
      calibration logic;
   wherein when an event occurs the calibration logic controls the voltage offset calibration switches to couple the differential inputs of the operational amplifier to the voltage reference and the output of the operational amplifier to the second input of the voltage comparator;
   whereby the voltage comparator causes the SAR to change output values to the voltage offset trim DAC so as to minimize an input offset voltage of the operational amplifier during an auto-calibration cycle initiated by the event.

2. The integrated circuit of claim 1, wherein the event is a user auto-calibration request.

3. The integrated circuit of claim 1, wherein the event is a power-on-reset.

4. The integrated circuit of claim 1, wherein the event is detection of a parity error in a stored auto-calibration data value.

5. The integrated circuit of claim 1, wherein the event is an ending time of an auto-calibration timer.

6. The integrated circuit of claim 5, wherein the auto-calibration timer time is programmable.

7. The integrated circuit of claim 1, wherein the event is a change in temperature of the integrated circuit.

8. The integrated circuit of claim 1, wherein the event is a change in supply voltage.

9. The integrated circuit of claim 1, further comprising an offset compensation latch register connected between the SAR and the voltage offset trim DAC, wherein the offset compensation latch register stores the SAR output value used to minimize the input offset voltage of the operational amplifier.

10. The integrated circuit of claim 1, wherein the voltage reference is programmable.

11. The integrated circuit of claim 1, further comprising the operational amplifier having a calibration output.

12. The integrated circuit of claim 11, wherein the calibration output instead of the output of the operational amplifier is coupled to the second input of the voltage comparator with the voltage offset calibration switches.

13. The integrated circuit of claim 12, wherein the output of the operational amplifier is a tri-state output and is decoupled from the calibration output when the input offset voltage of the operational amplifier is being minimized.

14. The integrated circuit of claim 1, wherein said auto-calibration circuit causes said operational amplifier to have high gain during the auto-calibration cycle.

15. The integrated circuit of claim 1, further comprising switches for selecting each one of a plurality of operational amplifiers during respective auto-calibration cycles therefore.

16. The integrated circuit of claim 15, further comprising:
a plurality of voltage offset trim DACs; and
a plurality of offset compensation latch registers connected between the SAR and respective ones of the plurality of voltage offset trim DACs, wherein each one of the plurality of offset compensation latch registers stores the SAR output value used to minimize the input offset voltage of respective ones of the plurality of operational amplifiers.

17. A method for minimizing an input offset voltage in an analog input device upon an occurrence of an event, said method comprising the steps of:
(a) detecting an occurrence of an event;
(b) switching from a normal mode to an auto-calibration mode upon detection of the occurrence of the event an analog input device having an input offset voltage compensation circuit;
(c) applying a reference voltage to the analog input device;
(d) minimizing an input offset voltage of the analog input device by:
(i) measuring an output voltage of the analog input device; and
(ii) applying input offset compensation values to the input offset voltage compensation circuit until the output voltage from the analog input device is at a desired value and then storing the input offset compensation value that minimizes the input offset voltage of the analog input device; and
(e) switching the analog input device from the calibration mode to the normal mode.

18. The method of claim 17, wherein the event is a user auto-calibration request.

19. The method of claim 17, wherein the event is a power-on-reset.

20. The method of claim 17, wherein the event is detection of a parity error in a stored auto-calibration data value.

21. The method of claim 17, wherein the event is an ending time of an auto-calibration timer.

22. The method of claim 17, wherein the step of switching the analog input device to a calibration mode includes the step of configuring the analog input device for high gain.

23. The method of claim 17, wherein the step of applying a reference voltage further comprises the step of applying a programmable reference voltage.

24. The method of claim 17, wherein the analog input device is a plurality of analog input devices and steps (b)-(e) are repeated for each one of the plurality of analog input devices.

* * * * *